(12) United States Patent
Tamada et al.

(10) Patent No.: US 7,780,877 B2
(45) Date of Patent: Aug. 24, 2010

(54) HIGH-FREQUENCY SUBSTRATE AND PRODUCTION METHOD THEREFOR

(75) Inventors: Masao Tamada, Takasaki (JP); Noriaki Seko, Takasaki (JP); Eiji Sakata, Fukuchi-machi (JP); Naoki Itoh, Fukuchi-machi (JP)

(73) Assignees: Japan Atomic Energy Agency, Ibaraki (JP); Kyushu Hitachi Maxell, Ltd., Fukuoka (JP)

( * ) Notice: Subject to any disclaimer, the term of this patent is extended or adjusted under 35 U.S.C. 154(b) by 0 days.

(21) Appl. No.: 12/096,873

(22) PCT Filed: Dec. 5, 2006

(86) PCT No.: PCT/JP2006/324197

§ 371 (c)(1),
(2), (4) Date: Jun. 10, 2008

(87) PCT Pub. No.: WO2007/069491

PCT Pub. Date: Jun. 21, 2007

(65) Prior Publication Data

US 2009/0127517 A1   May 21, 2009

(30) Foreign Application Priority Data

Dec. 14, 2005   (JP) .............................. 2005-359923

(51) Int. Cl.
   *H01B 1/02*   (2006.01)
   *H05K 3/38*   (2006.01)
   *B32B 15/082*   (2006.01)

(52) U.S. Cl. ...................... 252/512; 252/500; 156/150; 428/463

(58) Field of Classification Search ................. 252/512, 252/500; 156/150; 428/463
See application file for complete search history.

(56) References Cited

U.S. PATENT DOCUMENTS

| | | | | |
|---|---|---|---|---|
| 6,863,812 B2 * | 3/2005 | Sugo et al. | ................... | 210/294 |
| 2004/0087677 A1 * | 5/2004 | Sugo et al. | ................... | 522/3 |
| 2005/0215721 A1 | 9/2005 | Kawamura | | |
| 2005/0272876 A1 * | 12/2005 | Seko et al. | ................... | 525/242 |

FOREIGN PATENT DOCUMENTS

| | | | | |
|---|---|---|---|---|
| JP | 63072732 A | * | 4/1988 | |
| JP | S63-72732 | | 4/1988 | |
| JP | 2001007466 A | * | 1/2001 | |
| JP | 2002249611 A | * | 9/2002 | |
| JP | 2005248362 A | * | 9/2005 | |
| JP | 2005275173 A | * | 10/2005 | |
| WO | WO 02066549 A1 | * | 8/2002 | |

OTHER PUBLICATIONS

Miyazaki, et al. "Surface Reformation of Fluoropolymers by Electron Beam Graftpolymerization," Oct. 2001 (Translation).

* cited by examiner

*Primary Examiner*—Douglas Mc Ginty
(74) *Attorney, Agent, or Firm*—Fay Sharpe LLP

(57) ABSTRACT

The high-frequency substrate is constructed of a base member and a conductor adhered to the base member, and the base member is composed of a polymer which is a fluoropolymer having a conductor-affinitive monomer graftpolymerized at a grafting percentage of 1% or less by weight. After reactive sites necessary for graftpolymerization are formed on a film of a fluoropolymer under an oxygen-free atmosphere by irradiating the film with an electron beam or the like, the fluoropolymer film is introduced into a solution of a conductor-affinitive monomer so as to cause graftpolymerization, and a conductor is adhered thereto to thereby produce a substrate, with a grafting percentage of the monomer to the fluoropolymer being 1% or less by weight in the graftpolymerization. The technique leads to the production of a high-frequency substrate having superior adhesion force with respect to the conductor.

9 Claims, 4 Drawing Sheets

HIGH-FREQUENCY SUBSTRATE AND PRODUCTION METHOD THEREFOR

The present invention relates to a substrate used as an antenna substrate, a print substrate or the like, and more particularly relates to a novel technique for providing such a substrate which is favorably used in a high-frequency band.

BACKGROUND OF ART

In general, a substrate used as an antenna substrate, a print substrate or the like has a construction in which a conductor (conductive material) is adhered to a surface of a polymer (resin) forming an insulative base member (base material).

Recently, with the advent of the advanced information age, while there is a demand for miniaturization and higher speed of information and electronic equipment units, the frequency bands used are moving toward higher frequencies such as the millimeter wave and microwave bands. Owing to the shift toward higher frequencies, a need has arisen for substrates of the foregoing type, such as antenna substrates and print substrates, that are low in dielectric loss (low permittivity, low dielectric loss tangent) in the high-frequency band.

Among the conventionally-used materials for meeting this need are a variety of fluoropolymers, typically polytetrafluoroethylene. The fluoropolymers have relative dielectric constants on the order of 2.2, and there are also ones having a dielectric loss tangent (tan $\delta$) of 0.0006 among the fluoropolymers, which are superior materials featuring a small dielectric loss in comparison with polyimide (generally having a relative dielectric constant of 3.8 and dielectric loss tangent of 0.01) which is known as a low dielectric material. However, when the fluoropolymers are applied as the base member of a substrate such as an antenna substrate, print substrate or the like, they have a drawback of poor adherence to the conductor. Accordingly, modification of surface properties of the fluoropolymers has been attempted by using a variety of measures.

In general, conventionally, a variety of methods such as sodium processing, UV ozone method, corona discharging, plasma processing and so on have been proposed for the modification of the surface properties of the fluoropolymers (see, for example, Japanese Patent Application Publication No. 2005-517777: Patent-Reference 1; Japanese Patent Application Publication No. 2005-002318: Patent-Reference 2; Japanese Patent Application Publication No. H08-198984: Patent-Reference 3; Japanese Patent Application Publication No. 2003-261698: Patent-Reference 4; and so on). However, the conventional methods require troublesome measures, and many of the methods are unsuitable in view of the fact that the aforesaid characteristics for the base member of the substrate must be obtained.

Recently, it has been proposed to carry out modification of the surface properties of fluoropolymers by means of graftpolymerization using electron beam irradiation ("Surface Reformation of Fluoropolymers by Electron Beam Graftpolymerization" by Kouji Miyazaki et al., "Technical Report From Industrial Technology Center Of Fukui Prefecture", No. 200, Published on October, 2001: Non-Patent Reference 1). Nevertheless, this reference relates to only an analysis of conditions for electron beam graftpolymerization directed to the modification of the surface properties of the fluoropolymers to which an electroless plating can be applied, and discloses no improvement of an adhesion force (peel strength) to a conductor.

Patent-Reference 1: Japanese Patent Application Publication No. 2005-517777

Patent-Reference 2: Japanese Patent Application Publication No. 2005-002318

Patent-Reference 3: Japanese Patent Application Publication No. H08-198984

Patent-Reference 4: Japanese Patent Application Publication No. 2003-261698

Non-Patent Reference 1: "Surface Reformation of Fluoropolymers by Electron Beam Graftpolymerization" by Kouji Miyazaki et al., "Technical Report From Industrial Technology Center Of Fukui Prefecture", No. 200, Published on October, 2001

DISCLOSURE OF THE INVENTION

Problems to be Resolved by the Invention

An object of the present invention is to provide a novel technique by which a high-frequency substrate exhibiting superior adhesion force to a conductor can be obtained.

Means for Solving the Problems

The inventors conducted studies that led to the finding that a high-frequency substrate exhibiting superior adhesion force to a conductor can be obtained by using a grafted fluoropolymer exhibiting a low grafting percentage, and that such a high-frequency substrate can be prepared by means of graftpolymerization using electron beam irradiation or the like. Based on this finding, they achieved the present invention.

Thus, the present invention provides a high-frequency substrate constructed of a base member and a conductor adhered to the base member, wherein the base member is composed of a polymer which is a fluoropolymer having a conductor-affinitive monomer graftpolymerized at a grafting percentage (degree of grafting) of 1% or less by weight.

Further, in accordance with the present invention, there is provided, as one of methods for producing the high-frequency substrate as mentioned in the foregoing, a method which comprises the steps of (I) forming reactive sites necessary for graftpolymerization, on the film of a fluoropolymer under an oxygen-free atmosphere, (II) introducing the fluoropolymer film having the reactive sites thereon, into an oxygen-free solution in which a conductor-affinitive monomer is dissolved, so as to graftpolymerize the monomer to the fluoropolymer, wherein the grafting is carried out at a grafting percentage of the monomer to the fluoropolymer of 1% or less by weight, and (III) adhering a conductor to the surface of the film of the fluoropolymer after the graftpolymerization.

EFFECTS OF THE INVENTION

According to the present invention, it is possible to obtain a high-frequency substrate comprising a fluoropolymer base member exhibiting improved adhesion force to a conductor while maintaining superior high-frequency characteristics.

BEST MODE FOR CARRYING OUT THE INVENTION

Figure 1:
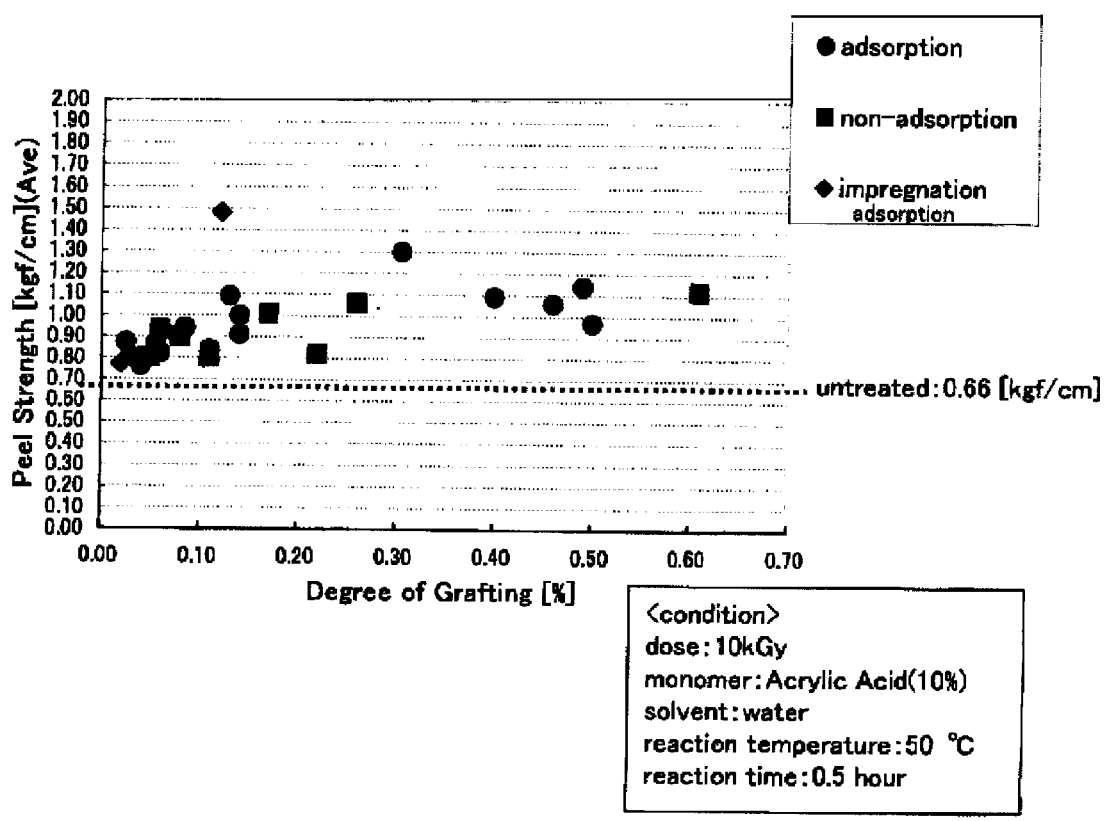
FIG. 1 shows by way of example a relationship between grafting percentages and peel strengths in a grafted PFEP substrate.

In the following, a description will be made of embodiments of the present invention along with the constituent elements of the substrate of the present invention and the respective steps of the method for producing the same.

The principle of the present invention can be applied to any type of substrate or board as long as it is constructed of a base member (base material) and a conductor adhered to the base member. The conductor is typified by copper foil, but is not limited thereto, and includes wiring, circuitry or the like made of a variety of electrically conductive materials.

For the high-frequency substrate of the present invention there can be used various types of fluoropolymers which are known as a low dielectric material. While particularly preferred are polytetrafluoroethylene (hereinafter sometimes abbreviated as PTFE) and tetrafluoroethylene-hexafluoropropylene copolymer (hereinafter sometimes abbreviated as PFEP, usable fluoropolymers are not limited thereto and include, for example, tetrafluoroethylene-perfluoroalkylvinylether copolymer (PFA), tetrafluoroethylene-ethylene copolymer (ETFE), polychlorofluoroethylene (PCTFE), chlorotrifluoroethylene-ethylene copolymer (ECTFE), polyvinylidene fluoride (PVPF), and polyvinyl fluoride (PVF).

In the high-frequency substrate of the present invention, the base member (base material) is composed of a polymer (a graft copolymer), i.e. a fluoropolymer, as mentioned above, as a backbone or main chain, to which a conductor-affinitive monomer is graftpolymerized.

Here, by "conductor-affinitive monomer" as termed with respect to the present invention is meant any monomer which has a functional group or atom affinitive with a conductor (metal), (or is susceptible to the direct introduction of a ligand affinitive with such functional group or atom) and also possesses reactive site (such as vinyl group, allyl group, and styryl group) for the graftpolymerization with a fluoropolymer as mentioned in the foregoing. Specifically, examples of such monomer include carboxyl group-containing monomers such as acrylic acid and methacrylic acid; glycidyl group-containing monomers such as glycidyl methacrylate and glycidyl acrylate; cyano group-containing monomers such as acrylonitrile and methacrylonitrile; styrene-based monomers such as styrene, styrene sodium sulfonate, and chloromethylene styrene; amine-based monomers such as allylamine; phosphate group-containing monomers; metal-affinitive group-containing monomers such as vinylpyridine; and monomers capable of being introduced with a ligand which is absorbable to such atom as nitrogen, sulfur or phosphorus.

In modifying the properties of a polymer by means of graftpolymerization of a monomer to the polymer, it is general to graft the monomer molecules as many as possible for effective development of the functions derived from the monomer. For example, in the modification of the surface properties of the fluoropolymer by the graftpolymerization as described in the above-mentioned Non-Patent Reference 1, it is understood that the grafting percentage should be made as high as possible so as to realize electroless plating. Additionally, in Japanese Patent Application Publication No. 2005-135681 (Patent Reference 5), which describes a solid polymeric electrolyte membrane produced by graftpolymerization of a reactive monomer to a fluororesin, the grafting percentages in the working Examples are in such high values as 37% to 41% by weight.

Patent-Reference 5: Japanese Patent Application Publication No. 2005-135681

By contrast, the present inventors have surprisingly discovered that too high a grafting percentage degrades the adherence to the base member (or lowers the peel strength). Thus, in the high-frequency substrate of the present invention, the base member is composed of a polymer which is a fluoropolymer having a conductor-affinitive monomer graftpolymerized thereto at a grafting percentage of 1% or less by weight. On the other hand, the lower limit of the grafting percentage is 0.01% by weight, and even with such a low grafting percentage, there can be obtained a high-frequency substrate having sufficient adherence to the conductor (see the working examples described later). It is to be noted, however, that no grafting degrades the adherence to the conductor (lowers the peel strength). Here, the grafting percentage (degree of grafting) is calculated as [(weight of fluoropolymer after graftpolymerization−weight of fluoropolymer before graftpolymerization)/(weight of fluoropolymer before graftpolymerization)]×100.

The high-frequency substrate of the present invention as mentioned above can be produced by the method comprising the following steps:

First, reactive sites (radicals) necessary for post-graftpolymerization are formed on a film of a fluoropolymer which is used as a low material. Although it is general that this step is carried out by irradiating the film of the fluoropolymer with radiation, it is possible to use chemicals [for example, di-t-butylperoxide (DTBP), potassium persulfate, azoisobutylnitrile (AIBN) and so on]. It is necessary to carry out the formation of the reactive sites under an oxygen-free atmosphere, specifically, an inert gas atmosphere including nitrogen, argon, helium or the like.

For the radiation used in the present invention, although it is possible to use $\gamma$ rays, X rays, electron beams, ion beams, ultraviolet rays or the like, it is preferable to use electron beams in that the carbon-fluorine bonds in the fluoropolymer can be easily cleaved to thereby form the reactive sites, as stated hereinafter. Although the present invention will be mainly explained with respect to the cases where electron beams are used as the radiation, the principle of the present invention can be equally applied to a case where another measure for forming the reactive sites is used.

By using the electron beams or the like, the carbon-fluorine bonds are cleaved so as to form the reactive sites necessary for the graftpolymerization. To this end, it is general to apply the radiation dose from 5 to 100 kGy. The larger the radiation dose, the more the carbon-fluorine bonds are cleaved, resulting in demerits that cause deterioration in the strength of the base member, and therefore the substrate per se. For the object of the present invention, a low radiation dose on the order of 10 kGy is preferable. This level of radiation dose is sufficient for cleaving the carbon-fluorine bonds. The acceleration voltage is, for example, from 2 MeV to 3 MdV (current from 1.0 mA to 2.0 mA). Although the thickness of the film of the fluoropolymer depends upon the type of the substrate concerned, it may be from 100 μm to 500 μm.

Next, after the formation of the reactive sites by the electron beams or the like, the fluoropolymer film is introduced (immersed) into a solution in which a conductor-affinitive monomer is dissolved so as to graftpolymerize the monomer to the fluoropolymer. Also, it is necessary to carry out this graftpolymerization under an oxygen-free condition, and thus it is executed while creating a vacuum (decompressing). It is general to use a water or a water/methanol mixture solvent for the solution dissolving the monomer.

Although the graftpolymerization is usually carried out by immersing the fluoropolymer film into the monomer solution after the formation of the reactive sites by the electron beams or the like (hereinafter, this procedure will be referred to as the liquid-phase method), it may be carried out by contacting the fluoropolymer film with a high-absorbency cloth impregnated with the monomer solution after the formation of the reactive sites by the electron beams or the like (hereinafter, this procedure will be referred to as the impregnation method).

The graftpolymerization step for producing the high-frequency substrate according to the present invention is characterized by the fact that the grafting percentage of the monomer to the fluoropolymer is 1% or less. Accordingly, it is unnecessary to set the monomer concentration to a high percentage of 50% as described in the above-mentioned Non-Patent Reference 5, and the monomer concentration is generally from 5% to 30% (weight %), preferably, from 5% to 15%. Depending upon the combination of the fluoropolymer and the monomer, the reaction time for the graftpolymerization is generally from 30 min to about 4 hr, and the reaction temperature is from 40° C. to 60° C., preferably, 50° C. When the fluoropolymer exhibits a relatively-high reactivity, it is preferable to carry out the graftpolymerization over a long time period while keeping the monomer concentration low. In this manner, by varying the conditions such as the reaction temperature, the reaction time, the monomer concentration and so on, it is possible to control the grafting percentage.

Next, the aforesaid graft-processed (graftpolymerized) fluoropolymer film is subjected to a step of adhering a conductor to a surface thereof, but, prior to this step, it is preferable to immerse the graftpolymerized fluoropolymer film in a solution of conductor so that the conductor is adsorbed on the surface of the graftpolymerized fluoropolymer film, if necessary. For example, by immersing the graftpolymerized fluoropolymer film into a copper nitrate solution, it is possible to render copper adsorbed on the surface of the graftpolymerized fluoropolymer film (hereinafter, this procedure will be referred to as the adsorption method).

In production of the high-frequency substrate of the present invention, although a variety of already-known measures are applicable for adhering the conductor to the surface of the graftpolymerized fluoropolymer film, in the present invention using the fluoropolymer exhibiting a low monomer grafting percentage, it is especially preferable to carry out the adhesion of the conductor by sputtering. A sputtering procedure per se does not need a special condition, and, by using an ordinary apparatus, for example, the adhesion of Cu (copper) or Cr (chromium) is carried out, and thus a film is formed.

In the following, examples are described in order to further and specifically clarify the features of the present invention, but the present invention is not limited to these examples.

Example 1

Peeling Tests of PFEP Substrate

The adhesion force (peel strength) of a conductor was investigated with respect to a substrate prepared using PFEP as a fluoropolymer, as follows:

After PFEP films (0.25 mm in thickness) were irradiated with 10 kGy electron beams at an acceleration voltage of 2 MeV and a current of 1.0 mA, the electron-beam irradiated PFEP films were immersed in an aqueous solution containing a 10% acrylic acid as a conductor-affinitive monomer to thereby cause a graftpolymerization reaction. The reaction temperature was 50° C., and the reaction time was 30 min. Note that, in accordance with the above-mentioned impregnation method, some of the samples were placed in a thermostatic chamber to thereby cause a graftpolymerization reaction over 30 min while creating a vacuum therein, with a high-absorbency cloth having been impregnated with acrylic acid (a 10% aqueous solution). Before the graftpolymerization reaction and after the graftpolymerization reaction, weights of the PFEP films were measured, using a precision balance (R200D/Sartorius K.K.), to thereby calculate grafting percentages.

After the graft-processing (graftpolymerization reaction), in accordance with the above-mentioned adsorption method, the graft-processed PFEP films were immersed into a copper nitrate solution (1 mM) while agitating the copper nitrate solution over 6 hr (30° C.), resulting in absorption of copper, and then they were subjected to a sputtering step. With respect to some of the samples, these graft-processed PFEP films were directly subjected to the sputtering step without being subjected to such adsorption of copper.

The sputterings were carried out using a small sputtering apparatus (SRV-4310/Shinko Seiki Co., Ltd.), a side sputtering apparatus (STH10311/Shinko Seiki Co., Ltd.) and a batch-type sputtering apparatus (CFS-12P-100/Shibaura Mechatronics Corporation) under the following conditions:

Temperature: 28° C., Humidity: 20%, Electric Power: RF, Ultimate Pressure (ex.): $5 \times 10^{-4}$ [Pa], Substrate Heating: None, Sputtering Pressure: (ex.): $6.7 \times 10^{-1}$ [Pa], Sputtering Power: 500 [W], Ar Flow rate: 40 SCCM, Reverse Sputtering: 100 [W]/5 [min], Pre-Sputtering: 5 [min], Target Cr: 50 nm in Thickness, Sputtering Time: 2' 30", Target Cu: 300 nm in Thickness, and Sputtering Time: 8' 10"

With respect to the PFEP substrates thus obtained, peeling tests (90-degree peeling tests) regarding conductors (copper foils) were carried out to thereby examine the peel strengths. The procedure for the peeling tests was as follows:

A material (substrate) was cut in at its ends so that copper foils having width of 10 mm were left thereon. Then, a copper foil was peeled at a constant speed (50 mm/1 min) by pulling away an end thereof in the vertical direction, to thereby measure the peel strength. In the arrangement of a measurement system used, a push/pull gage (MODEL-RX-5/Aiko Engineering Co., Ltd., Measuring Range: ~50) for force measurement was utilized, and was securely attached to a test stand. In order to keep the peeling direction vertical, a wire-interlocking type slide table was used.

The results of the peeling tests are shown in FIG. 1 and Tables 1-4. As shown in these, when the grafting percentage was small, it was found that the peel strength was significantly improved in comparison with a peel strength (0.66 [kgf/cm]) in untreated cases (PFEP substrates not subjected to electron-beam radiation and graftpolymerization). Specifically, for example, when the grafting percentage was 0.12%, the peel strength was 1.48 [kgf/cm], and thus it was found that the adhesion forces of the copper foils were considerably superior to 0.66 [kgf/cm] of the untreated products. It is considered that the superiority of the adhesion forces is due to the fact that the carboxyl group of acrylic acid was bonded to carbon atoms uncoupled by the electron beams so that the carboxyl group was bonded to copper.

Figure 2:
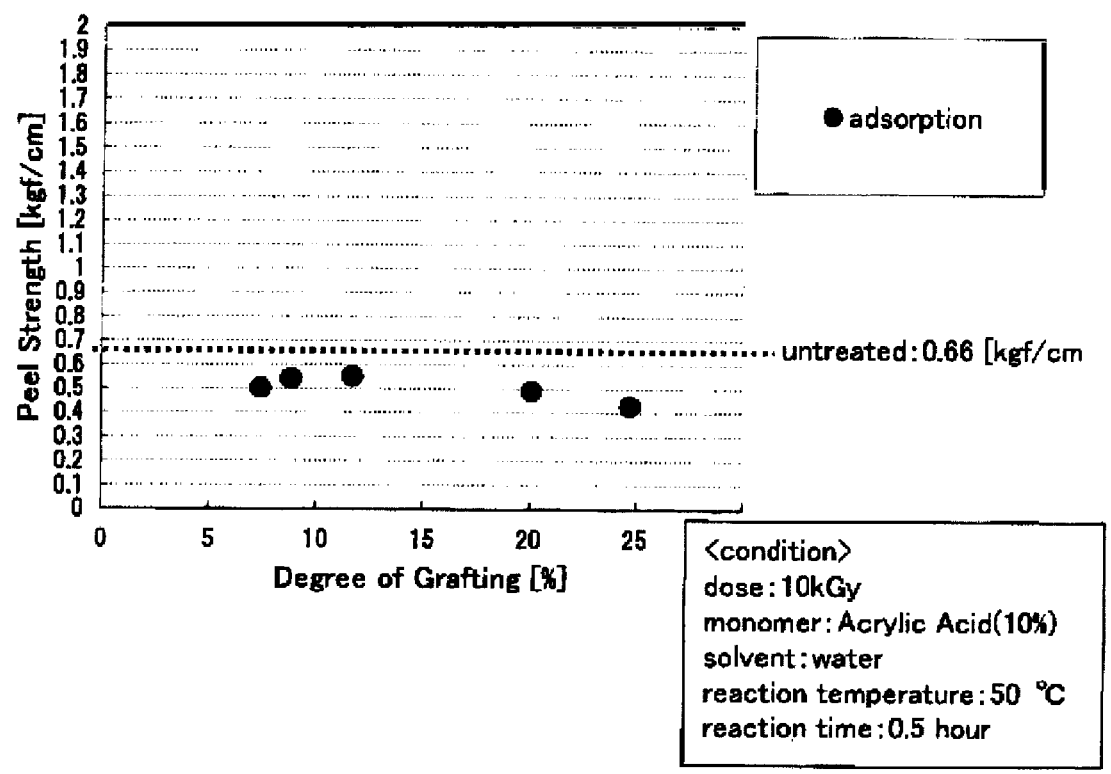
FIG. 2 shows by way of example a relationship between grafting percentages and peel strengths in a grafted PFEP substrate, wherein the grafting percentages are especially high.

FIG. 2 and Table 4 show the results of the copper-foil peeling tests when the PFEP substrates exhibited a high grafting percentage. When the grafting percentage was too large, it was found that the peel strength was reduced. Specifically, for example, when the grafting percentage was 24.7%, the peel strength was 0.43 [kgf/cm], and thus it was found that the adhesion forces of the copper foils were inferior to 0.66 [kgf/cm] of the untreated products. It is considered that the inferiority of the adhesion forces was due to the fact that a large amount of monomers such as acrylic acid and so on were adhered to the surface of the substrate so that the adhesion forces diminished upon the layer formation by the sputtering after the graft-processing, because of the graft distribution on the surface of the substrate, the irregularity on the surface of substrate and so on.

TABLE 1

Adsorption, Liquid-Phase Method

| Test No. | Grafting Percentage [%] | Peel Strength (ave) [kgf/cm] |
|---|---|---|
| 1 | 0.04 | 0.80 |
| 2 | 0.14 | 0.91 |
| 3 | 0.46 | 1.06 |
| 4 | 0.49 | 1.14 |
| 5 | 0.40 | 1.09 |
| 6 | 0.50 | 0.97 |
| 7 | 0.14 | 1.00 |
| 8 | 0.06 | 0.82 |
| 9 | 0.11 | 0.84 |
| 10 | 0.13 | 1.09 |
| 11 | 0.04 | 0.76 |
| 12 | 0.06 | 0.86 |
| 13 | 0.03 | 0.87 |
| 14 | 0.09 | 0.94 |
| 15 | 0.03 | 0.80 |

TABLE 2

Non-Adsorption, Liquid-Phase Method

| Test No. | Grafting Percentage [%] | Peel Strength (ave) [kgf/cm] |
|---|---|---|
| 1 | 0.22 | 0.82 |
| 2 | 0.61 | 1.12 |
| 3 | 0.08 | 0.90 |
| 4 | 0.11 | 0.08 |
| 5 | 0.05 | 0.08 |
| 6 | 0.17 | 1.01 |
| 7 | 0.06 | 0.93 |

TABLE 3

Impregnation Method (Non-Absorption)

| Test No. | Grafting Percentage [%] | Peel strength (ave) [kgf/cm] |
|---|---|---|
| 1 | 0.12 | 1.48 |
| 2 | 0.02 | 0.77 |

TABLE 4

| Test No. | Grafting Percentage [%] | Peel strength (ave) [kgf/cm] |
|---|---|---|
| 1 | 24.7 | 0.43 |
| 2 | 20.1 | 0.49 |
| 3 | 11.7 | 0.55 |
| 4 | 7.4 | 0.50 |
| 5 | 8.8 | 0.54 |

Example 2

Peeling Tests of PTFE Substrate

Using PTFE films (0.3 mm in thickness) in place of the PFEP films, a peel strength of the substrate was investigated in a similar manner to in Example 1 (except that the reaction temperatures were as shown in the respective top margins of the following tables).

Figure 3:
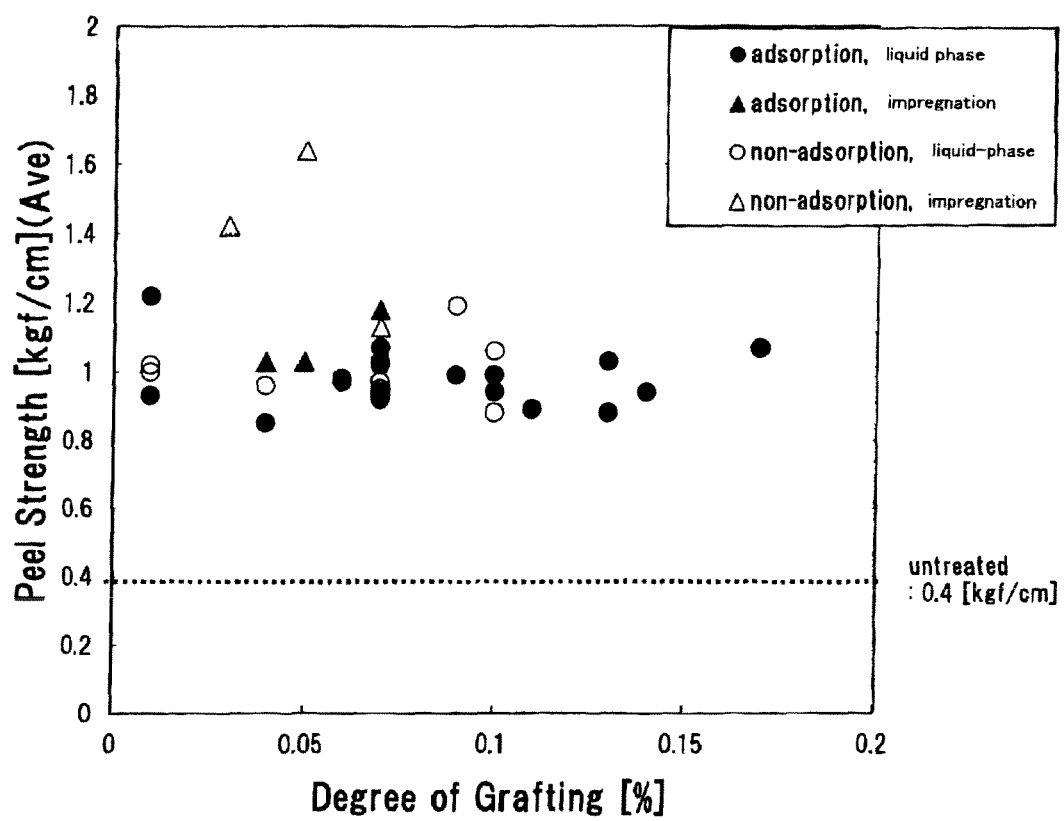
FIG. 3 shows by way of example a relationship between grafting percentages and peel strengths in a grafted PTFE substrate.
Figure 4:
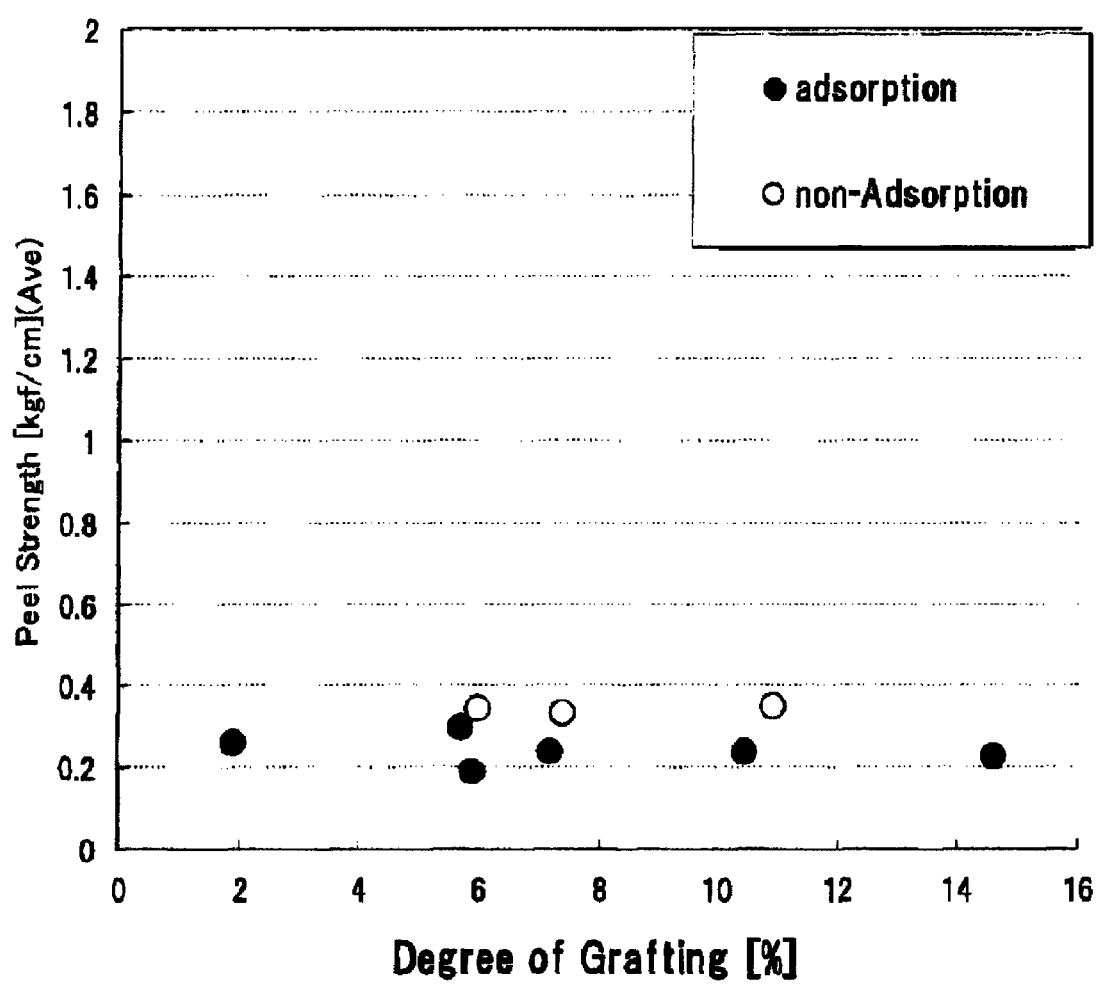
FIG. 4 shows by way of example a relationship between grafting percentages and peel strengths in a grafted PTFE substrate, wherein the grafting percentages are especially high.

The results are shown in Tables 5-8 and FIG. 3. In this case, the peel strength of the untreated substrates was 0.40 [kgf/cm]. Specifically, for example, when the grafting percentage was 0.05%, the peel strength was 1.64 [kgf/cm], and thus it was found that the adhesion forces of the copper foils were considerably superior to 0.40 [kgf/cm] of the untreated products. In the tables, "time" indicates the reaction time for the graftpolymerization. Further, Table 9 and FIG. 4 show the results of the copper-foil peeling tests when the PTFE substrates exhibited a high grafting percentage. Also, in the PTFE substrates, when the grafting percentage was small, it was found that the peel strength was significantly improved. However, when the grafting percentage was too large, it was found that the peel strength was inferior. Specifically, for example, when the grafting percentage was 10.4%, the peel strength was 0.24 [kgf/cm], and thus it was found that the adhesion forces of the copper foils were inferior to 0.40 [kgf/cm] of the untreated products.

TABLE 5

Adsorption, Time: 0.5-3.0 h, Liquid-Phase Method

| Test No. | Grafting Percentage [%] | Peel Strength (ave) [kgf/cm] |
|---|---|---|
| 1 | 0.01 | 1.22 |
| 2 | 0.09 | 0.99 |
| 3 | 0.07 | 1.07 |
| 4 | 0.06 | 0.98 |
| 5 | 0.17 | 1.07 |
| 6 | 0.13 | 1.03 |
| 7 | 0.07 | 1.02 |
| 8 | 0.14 | 0.94 |
| 9 | 0.11 | 0.89 |
| 10 | 0.07 | 1.03 |
| 11 | 0.04 | 0.85 |
| 12 | 0.06 | 0.97 |
| 13 | 0.07 | 0.94 |
| 14 | 0.07 | 0.92 |
| 15 | 0.10 | 0.99 |
| 16 | 0.07 | 0.93 |
| 17 | 0.13 | 0.88 |
| 18 | 0.01 | 0.93 |
| 19 | 0.10 | 0.94 |

TABLE 6

Adsorption, Time: 1.0-3.4 h, Impregnation Method

| Test No. | Grafting Percentage [%] | Peel Strength (ave) [kgf/cm] |
|---|---|---|
| 1 | 0.04 | 1.03 |
| 2 | 0.05 | 1.03 |
| 3 | 0.07 | 1.18 |

TABLE 7

Non-Adsorption, Time: 0.5-3.0 h, Liquid-Phase Method

| Test No. | Grafting Percentage [%] | Peel Strength (ave) [kgf/cm] |
|---|---|---|
| 1 | 0.01 | 1.0 |
| 2 | 0.07 | 0.97 |
| 3 | 0.04 | 0.96 |
| 4 | 0.09 | 1.19 |
| 5 | 0.07 | 0.95 |
| 6 | 0.10 | 1.06 |
| 7 | 0.01 | 1.02 |
| 8 | 0.10 | 0.88 |

TABLE 8

Non-Adsorption, Time: 1.6-2.0 h, Impregnation Method

| Test No. | Grafting Percentage [%] | Peel Strength (ave) [kgf/cm] |
|---|---|---|
| 1 | 0.05 | 1.64 |
| 2 | 0.03 | 1.42 |
| 3 | 0.07 | 1.13 |

TABLE 9

Adsorption, Dose: 10-20 kGy, Time: 1.0-3.5 h, Monomer Concentration: 10-50%

| Test No. | Grafting Percentage [%] | Peel Strength (ave) [kgf/cm] |
|---|---|---|
| 1 | 1.9 | 0.26 |
| 2 | 10.4 | 0.24 |
| 3 | 7.2 | 0.24 |
| 4 | 14.6 | 0.23 |
| 5 | 5.7 | 0.3 |
| 6 | 5.9 | 0.19 |
| 7 | 7.4 | 0.33 |
| 8 | 10.9 | 0.35 |
| 9 | 7.4 | 0.44 |
| 10 | 6.0 | 0.34 |

Example 3

Measurement of Relative Dielectric Constant

With respect to some of the PFEP substrates and the PTFE substrates, relative dielectric constants ($\epsilon r$) were measured. The measurement of the relative dielectric constants was carried out by the resonator method using a vector network analyzer and a wave-guide type resonator. In the resonator method, a small material is introduced into the resonator, and the resonance frequency to a resonance mode is measured based on the perturbation method, resulting in the measurement of the relative dielectric constants.

The measurement results of the PFEP substrates and the measurement results of the PTFE substrates are shown in Tables 10 and 11, respectively, together with the above-mentioned results of peel strength. Note that these substrates were all produced using the absorption method. In the case of PFEP, the relative dielectric constant of the untreated products was 2.15, and, in the case of PTFE, the relative dielectric constant of the untreated products was 2.13. As shown in Tables 10 and 11, while the substrates according to the present invention featured the large peel strengths, they still retained the relative dielectric constants, and were superior in dielectric characteristic.

TABLE 10

PFEP (t = 0.25 mm)

| Item | Grafting Percentage [%] | $\epsilon r$ | Peel Strength (ave) [kgf/cm] |
|---|---|---|---|
| 1 | 0.04 | 2.22 | 0.80 |
| 2 | 0.14 | 2.23 | 0.91 |
| 3 | 0.46 | 2.16 | 1.06 |
| 4 | 0.49 | 2.24 | 1.14 |
| 5 | 0.40 | 2.22 | 1.09 |
| 6 | 0.50 | 2.20 | 0.97 |

TABLE 11

PTFE (t = 0.3 mm)

| Item | Grafting Percentage [%] | $\epsilon r$ | Peel strength (ave) [kgf/cm] |
|---|---|---|---|
| 1 | 0.07 | 2.20 | 0.93 |
| 2 | 0.13 | 2.22 | 0.88 |
| 3 | 0.07 | 2.14 | 1.02 |
| 4 | 0.14 | 2.19 | 0.94 |
| 5 | 0.11 | 2.17 | 0.89 |
| 6 | 0.07 | 2.17 | 1.03 |

The invention claimed is:

1. A high-frequency substrate constructed of a base member and a conductor adhered to the base member, wherein the base member is composed of a fluoropolymer of polytetrafluoroethylene or tetrafluoroethylene-hexafluoropropylene copolymer, the fluoropolymer having a conductor-affinitive monomer of acrylic acid graftpolymerized thereto at a grafting percentage of 0.01%-1% by weight of the fluoropolymer before graftpolymerization.

2. The high-frequency substrate as claimed in claim 1, wherein the conductor is copper and includes an electrically conductive circuit or wiring.

3. A method for producing a high-frequency substrate, constructed of a base member and a conductor adhered to the base member, wherein the base member is composed of a polymer which is a fluoropolymer film having a conductor-affinitive monomer graftpolymerized thereto, which comprises the steps of:

(I) forming reactive sites necessary for graftpolymerization, on the film of fluoropolymer under an oxygen-free atmosphere, wherein the fluoropolymer has a thickness of 100 μm to 500 μm, and wherein the reactive sites are formed by applying an electron beam to the fluoropolymer film, with a radiation dose of from 5 to 100 kGy, an acceleration voltage of from 2 MeV to 3 MeV, and a current of from 1.0 mA to 2.0 mA, (II) introducing the fluoropolymer film having the reactive sites thereon, into an oxygen-free solution in which a conductor-affinitive monomer is dissolved, so as to graftpolymerize the monomer to the fluoropolymer, wherein the grafting is carried out at a graftpolymerization percentage of the monomer to the fluoropolymer of 0.01%-1% by weight of the fluoropolymer before graftpolymerization the fluoropolymer is polytetrafluoroethylene or tetrafluoroethylene-hexafluoropropylene copolymer, and the monomer is acrylic acid, and (III) adhering a conductor to the surface of the film of the fluoropolymer after the graftpolymerization.

4. The method for producing the high-frequency substrate as claimed in claim 3, wherein the step (III) of conductor adhering is carried out by sputtering.

5. The method of for producing the high-frequency substrate as claimed in claim 3, wherein the method further includes the step of immersing the fluoropolymer film after the graftpolymerization in a solution of conductor, thereby rendering the conductor adsorbed on the surface of the fluoropolymer film after the graftpolymerization.

6. The method for producing the high-frequency substrate as claimed in claim 1, wherein the grafting percentage is calculated as [(weight of fluoropolymer after graftpolymerization-weight of fluoropolymer before graftpolymerization)/(weight of fluoropolymer before graftpolymerization)]×100.

7. The high-frequency substrate as claimed in claim 1, wherein the fluoropolymer comprises a film having a thickness of 100 μm to 500 μm.

8. A high-frequency substrate constructed of a base member and a conductor adhered to the base member, wherein the base member is composed of a fluoropolymer film of polytetrafluoroethylene or tetrafluoroethylene-hexafluoropropylene copolymer, the fluoropolymer film having acrylic acid monomer graftpolymerized thereto at a grafting percentage of 0.01%-1% by weight of the fluoropolymer before graftpolymerization, the high-frequency substrate being formed by a method which comprises:

forming reactive sites on a fluoropolymer layer comprising irradiating the fluoropolymer layer with an electron beam which cleaves fluorine-carbon bonds to form the reactive sites; and thereafter, introducing the fluoropolymer film having the reactive sites thereon into an oxygen-free solution in which acrylic acid is dissolved; and graftpolymerizing the acrylic acid monomer to the fluoropolymer at a grafting percentage of 0.01%-1% by weight of the fluoropolymer before graftpolymerization.

9. The method for producing the high-frequency substrate as claimed in claim 3, wherein the grafting percentage is calculated as [(weight of fluoropolymer after graftpolymerization-weight of fluoropolymer before graftpolymerization)/(weight of fluoropolymer before graftpolymerization)]×100.

* * * * *